United States Patent
Belledent (10) Patent No.: US 9,564,328 B2
(45) Date of Patent: Feb. 7, 2017

(54) METHOD FOR FABRICATING A TEMPLATE OF CONDUCTORS ON A SUBSTRATE BY MEANS OF BLOCK COPOLYMERS

(71) Applicant: COMMISSARIAT À L'ENERGIE ATOMIQUE ET AUX ENERGIES ALTERNATIVES, Paris (FR)

(72) Inventor: Jérôme Belledent, Meylan (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/760,382

(22) PCT Filed: Jan. 17, 2014

(86) PCT No.: PCT/FR2014/000010
§ 371 (c)(1),
(2) Date: Jul. 10, 2015

(87) PCT Pub. No.: WO2014/111637
PCT Pub. Date: Jul. 24, 2014

(65) Prior Publication Data
US 2015/0340232 A1    Nov. 26, 2015

(30) Foreign Application Priority Data
Jan. 18, 2013    (FR) ..................... 13 00113

(51) Int. Cl.
*H01L 21/311*    (2006.01)
*H01L 21/033*    (2006.01)
*H01L 21/768*    (2006.01)

(52) U.S. Cl.
CPC ..... *H01L 21/0337* (2013.01); *H01L 21/31144* (2013.01); *H01L 21/76816* (2013.01)

(58) Field of Classification Search
CPC ........... H01L 21/0337; H01L 21/76816; H01L 21/76811; H01L 21/76813; H01L 21/31144; H01L 21/3086; H01L 21/3088; H01L 21/32139; H01L 21/823431; G03F 7/70441; G03F 1/36; G03F 7/705; G03F 1/82
See application file for complete search history.

(56) References Cited

U.S. PATENT DOCUMENTS 7,990,056 B2    8/2011    Mourey
2007/0224819 A1    9/2007    Sandhu
(Continued)

FOREIGN PATENT DOCUMENTS

| FR | 2960700 A1 | 12/2011 |
|----|-----------|---------|
| SG | 180136 A1 | 5/2012 |
| WO | 2011/151243 A1 | 12/2011 |

OTHER PUBLICATIONS

Jul. 4, 2014 Written Opinion issued in International Patent Application No. PCT/FR2014/000010.
(Continued)

*Primary Examiner* — Robert Bachner
(74) *Attorney, Agent, or Firm* — Oliff PLC (57) ABSTRACT

The method for fabricating patterns made from first material having: providing a substrate covered by a covering layer, forming a first mask by means of a self-assembled structure of block copolymers, the first mask having first patterns, making a second mask from the first mask, the second mask having a second series of patterns organized according to the first repetition pitch or an integral multiple of the first repetition pitch, the second series having less patterns than the first series, depositing and exposing a resin layer to form an intermediate mask on the first mask, the intermediate mask covering a part of the first patterns formed in the first mask and having second holes facing the first holes, etching
(Continued)

the covering layer through the facing first and second holes to form third holes, filling the third holes with a first material to form the patterns made from first material.

19 Claims, 6 Drawing Sheets

(56) References Cited

U.S. PATENT DOCUMENTS

| | | |
|---|---|---|
| 2009/0236309 A1 | 9/2009 | Millward et al. |
| 2011/0008956 A1* | 1/2011 | Lee .................... H01L 21/0337 438/618 |
| 2012/0107583 A1 | 5/2012 | Xiao et al. |
| 2013/0072017 A1 | 3/2013 | Belledent et al. |
| 2013/0087527 A1 | 4/2013 | Pain et al. |
| 2014/0038107 A1* | 2/2014 | Chen .................. H01J 37/3174 430/296 |

OTHER PUBLICATIONS

Jul. 4, 2014 International Search Report issued in International Patent Application No. PCT/FR2014/000010.
Yi et al.; "Contact Hole Patterning for Random Logic Circuits using Block Copolymer Directed Self-Assembly;" Alternative Lithographic Technologies III; Proc. of SPIE; vol. 8323; 2012.
Oria et al.; "Guided self-assembly of block-copolymer for CMOS technology: a comparative study between grapho-epitaxy and surface chemical modification;" Alternative Lithographic Technologies III; Proc. of SPIE; vol. 7970; 2011.

* cited by examiner

METHOD FOR FABRICATING A TEMPLATE OF CONDUCTORS ON A SUBSTRATE BY MEANS OF BLOCK COPOLYMERS

BACKGROUND OF THE INVENTION

The present invention relates to fabrication of very dense patterns on a substrate comprising the use of block copolymers, and advantageously relates to a method for fabricating electric conductors.

STATE OF THE ART

In order to produce more and more complex objects of increasingly smaller size, the microelectronics industry is continuously seeking to design components that of smaller and smaller size. For example the length of a transistor gate has been reduced from 25 nanometres in 2007 to 14 nanometres in 2012.

For this purpose, the templates of conductors made on printed circuits have to be more and more dense. Several fabrication methods can be envisaged to achieve this.

In photolithography, a sensitive layer deposited on the substrate is exposed with an ultraviolet beam through a mask defining patterns. The size of the smallest pattern that is able to be made is closely linked to the wavelength of the beam used: the shorter the wavelength, the finer the pattern achieved and the higher the integration density can be.

Conventionally, ultraviolet beams used in photolithography have a wavelength of 193 or 248 nanometres. This type of lithography presents the advantage of being very well controlled and inexpensive. However, with such wavelengths it is impossible to achieve the integration densities of forthcoming technological nodes.

To produce thin patterns by photolithography techniques, it is possible to use a deep ultraviolet radiation. However, the use of such wavelengths has the effect of generating optic problems (shadowing, non-telecentric object space, etc.) detrimental to good definition of the fabricated patterns.

In alternative manner, very thin and dense patterns can be made on a substrate by means of an electron beam of very narrow diameter. Nevertheless, as the definition of the patterns is made point by point and not in global manner as in photolithography, definition of the patterns takes much longer. Furthermore, when it is the width of the beam that defines the width of the pattern, problems of electron dispersion and backscattering are detrimental to control of the final size of the printed patterns.

The use of block copolymers in lithography is currently the subject of numerous studies. This type of structure does in fact present the advantage of generally self-assembling in cylinders, spheres or strips with a very good resolution on the nanometric scale. By covering a substrate with a layer of block copolymers and selectively stripping one of the polymers, it is therefore possible to create thin patterns with a great density.

One way of using block copolymers and in particular chemical epitaxy consists in forcing assembly of the blocks of copolymers by modification of the chemical properties of portions of the substrate. The substrate then comprises areas on its surface having a different affinity with one of the constituents of the copolymer which imposes the assembly of the different blocks of the copolymer. This technique can be used in order to improve the resolution of the domains formed by each type of polymer.

An alternative method is graphic epitaxy. The method described in Patent application US 2012/0107583 A1 illustrates this technique. This document describes a technique for producing templates of conductors on a substrate based on the combination of lithography and the use of block copolymers such as polystyrene-block-polymethylmethacrylate (PS-b-PMMA) or polystyrene-block-polydimethylsiloxane (PS-b-PDMS). In a first step, a template of first patterns (a polystyrene brush for example) is produced by electron beam lithography on a quartz or silicon substrate. This template enables formation of the polymer blocks to be guided after the latter have been deposited in order to improve the resolution of the pattern which they create when self-assembling. Once annealed, the block copolymer layer is then exposed and etched so as to eliminate one of the two types of polymer to create cavities. At this stage, a layer of chromium is evaporated on the sample to create the conductor template, and the hard mask is then eliminated by the lift-off technique. This step of the method also enables the portions of the chromium layer that are not required to be eliminated. Finally, the sample is subjected to a dioxygen plasma to eliminate all the organic traces.

The document entitled "Contact Hole Patterning for Random Logic Circuits using Block Copolymer Directed Self-Assembly" (SPIE Vol. 8323) is another example of use of block copolymers in lithography. In the same way as in the method disclosed in US Patent application 2012/0107583, a conventional lithography is performed in a first step. The template of first patterns formed by means of this lithography is then used as guide for patterning a layer of block copolymers. The patterns are made in such a way that the cavities formed by means of the block copolymers correspond to the design chosen for the integrated circuit. As the different patterns are formed by successive exposures, different misalignments originating from the different exposures exist. It is then very difficult to perform a new photolithography step as the different misalignments values have to be taken into account.

With present-day technological tools, it is impossible to achieve a three-dimensional template of conductors in a single exposure. The substrate is therefore exposed several times in order to produce the whole of the 3D template, which gives rise to a certain number of problems and in particular to a misalignment between the different levels made.

OBJECT OF THE INVENTION

It is observed that a requirement exists to provide a method for fabricating patterns able to present dense areas and areas that are more spaced apart of identical or substantially identical patterns, the method being simple to implement.

The object of the invention consists in remedying the above-mentioned shortcomings by implementing a method for fabricating patterns made from a first material comprising the following steps:
  providing a substrate covered by a covering layer,
  forming a first mask by means of a self-assembled structure of block copolymers, the first mask defining a first series of first patterns organized with a first repetition pitch,
  making a second mask from the first mask, the second mask comprising a second series of patterns organized according to the first repetition pitch or an integral multiple of the first repetition pitch, the second series comprising less patterns than the first series,
  etching the covering layer through the second mask to define patterns in the covering layer.

Furthermore, the intermediate mask is advantageously formed by electron beam lithography by means of a beam having a resolution which is at least twice that of the width of the first patterns which it is sought to uncover. This criterion enables each first hole to be entirely reopened. The use of a direct write tool by multiple electron beams is particularly recommended to perform this step of the method, for reasons of speed of execution.

The template of first dots can advantageously be formed in such a way that at least two of its base lines form an angle of 45°. This is particularly advantageous when two levels of metals which have to be connected have an identical pitch in so far as two lines of metal of an upper layer are prevented from being connected to the same line of metal of a lower level.

Furthermore, according to a first embodiment, the template of first dots is achieved by modification of the chemical affinity of portions of the crystal substrate.

In alternative manner, the template of first dots can be created by photolithography. In this case, the first holes are formed by graphic epitaxy and photolithography.

BRIEF DESCRIPTION OF THE DRAWINGS

Other advantages and features will become more clearly apparent from the following description of particular embodiments of the invention given for non-restrictive example purposes only and represented in the appended drawings, in which.

DETAILED DESCRIPTION

Figure 1:
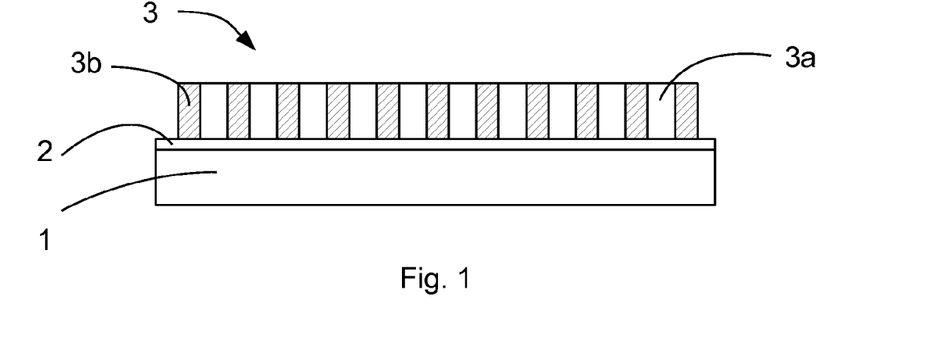
FIGS. 1 to 14 illustrate an embodiment of the method in schematic manner.

As illustrated in FIG. 1, a substrate 1 is provided and is covered by a covering layer 2 and a layer of block copolymers 3 comprising at least first 3a and second 3b polymers. The block copolymer layer 3 forms a self-assembled structure of block copolymers.

Depending on the block copolymers 3a and 3b used and on the configuration sought for, the structure formed can be an alternation of lines made from first and second polymers. It is also possible to form cylindrical patterns made from the first polymer which are sunk into the second polymer. In general manner, depending on the polymer used and on its conditions of use, it is possible to obtain a self-assembly in strips, cylinders, spheres or other shapes.

The use of a block copolymer layer 3 enables a repetitive pattern to be formed simply with dimensions and shape that are known in advance. Furthermore, the use of the block copolymers enables patterns to be formed having small dimensions with a repetition pitch which can be small. The dimensions of the pattern and/or the repetition pitch of these patterns can be lower than or of the same order of magnitude as the technical capacities of the lithography methods. On account of this, as deposition of copolymer layer 3 and assembly of the different polymers within the layer is fast, it is particularly advantageous to use this repetitive pattern definition technique instead of a more expensive and/or less fast photolithography technique. The use of a copolymer layer also enables patterns to be formed with a better resolution, a better dimensional uniformity and with a reduced line edge roughness.

In the case where copolymer layer 3 does not intrinsically present patterns with the right dimensions and/or with a suitable repetition pitch, it is possible to force copolymer layer 3 to adjust the dimensions of its patterns and/or its repetition pitches.

This constraint on copolymer layer 3 can be applied for example in two different manners. In a first embodiment corresponding to the graphic epitaxy technique and presented in FIG. 2, a template of salient first dots 4 is present or formed at the surface of substrate 1, for example on covering layer 2.

Figure 2:
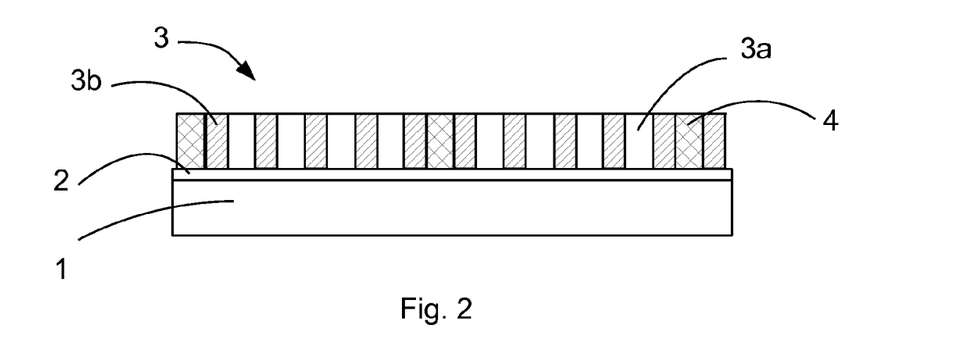

Block copolymer layer 3 is deposited on covering layer 2 and is located between the salient first dots 4. Between two successive first dots 4, copolymer layer 3 reassembles in order to present repetitive patterns with a repetition pitch $P_1$ which is compatible with the distance imposed between two first dots 4.

According to the graphic epitaxy technique, the template of first dots 4 acts as guide for self-assembly of block copolymer layer 3. In the example represented for illustrative purposes, a layer of block copolymers composed of two types of macromolecules is deposited for example by spin-coating. In alternative manner to copolymer diblocks, copolymer triblocks, copolymer multiblocks and so on, could also be used.

Figure 3:
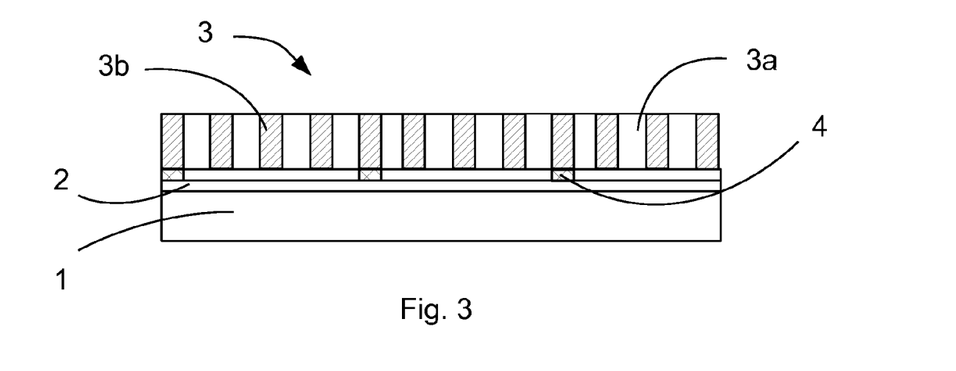

In an alternative technique presented in FIG. 3 and corresponding to chemical epitaxy, the surface of substrate 1 presents areas having different affinities with block copolymer layer 3 so as to form a template of first dots 4. The difference of chemical affinity acts in the same way as the mechanical constraint of dots 4 and imposes the position of one of the polymers of copolymer layer 3. In this configuration, covering layer 2 is flat and is formed in two different manners at the surface on any layer designed to receive the copolymer layer.

In this way, copolymer layer 3 presents an alternation of repetitive patterns with dimensions and/or a repetition pitch $P_1$ defined by the length of the polymer chain and to a lesser extent by the distance between two successive dots 4 having a particular affinity with one of the polymers.

It is possible to form a surface with areas having differences of affinity simply, for example by using a surface formed by patterns made from two different materials. The two materials have a different affinity with one or more polymers of copolymer layer 3.

In certain embodiments, copolymer layer 3 does not present self-assembly of the polymers to form a repetitive template of patterns. It may be necessary to perform thermal annealing in order to obtain self-assembly of the patterns.

Dots 4 can form a repetitive pattern, for example lines spaced apart from one another with a larger repetition pitch than that of the future patterns defined in copolymer layer 3. It can also be envisaged to have certain dots 4 presenting a repetition and other dots which are used to protect substrate 1 and which do not comply with a repetition logic.

In an alternative embodiment, an additional placing mask is formed on substrate 1. This additional placing mask can be formed by photolithography techniques with the required resolution, for example with wavelengths at 193 nm or 248 nm, i.e. with a low resolution.

Once the additional placing mask has been made, lateral spacers covering the side walls of the additional mask are formed. The lateral spacers are fabricated by any suitable technique, for example by conformal deposition of spacer material followed by anisotropic etching.

The additional placing mask is eliminated and the lateral spacer forms dot 4 which forces the assembly of copolymer layer 3. This technique enables dots 4 of small width to be fabricated while using a low-resolution photolithography technique. This alternative embodiment enables dots 4 to be achieved which can occupy a small surface on substrate 1. This configuration makes it possible to achieve a low or even non-existent shadowing effect originating from dots 4.

Depending on the copolymer used, the copolymer can form an alternation of first and second patterns, for example two patterns that are substantially identical in shape, for example lines (two patterns made from the first polymer are separated by a pattern made from the second polymer and vice-versa). It is also possible to form a plurality of patterns made from the first polymer which are sunk in a matrix formed by a second polymer.

Copolymer layer 3 textured by means of the different patterns 6 forms a first mask 5. As first mask 5 is formed from copolymer layer 3, it presents a first series of identical or substantially identical patterns 6 with a first repetition pitch $P_1$ that is substantially constant in all the areas covered by layer 3. However, as in the prior art, such a mask is not practical to use as it is limited to a single pattern density.

In one embodiment, first patterns 6 (for example holes) present a first repetition pitch $P_1$ in a single direction which is parallel to the surface of substrate 1. In another embodiment, first patterns 6 present first repetition pitches $P_{1X}$ and $P_{1Y}$ in a first direction and a second direction. The two directions are secant and are parallel to the surface of substrate 1. The repetition pitches can be different in the two directions or identical.

A second mask 7 is made from first mask 5. Second mask 7 comprises a part of patterns 6 of first mask 5. In this way, the patterns of second mask 7 have the same position as the patterns of first mask 5, but a part of patterns 6 is not used. There are therefore less patterns in second mask 7 than in first mask 5. Second mask 7 defines a second series of patterns which is smaller in number than the first series of patterns 6 of first mask 5.

As the second series of patterns is defined by taking a part of the first series of patterns 6, the patterns of the second series keep the same spatial coherence as that defined by the self-assembly of copolymer layer 3. The patterns of the second series are separated from one another, in the direction of repetition, by the repetition pitch or by an integral multiple of the repetition pitch. It is possible to form several distinct sets of patterns, in second mask 7, all originating from first mask 5. In advantageous manner, two distinct sets of patterns are separated by a distance that is larger than twice the repetition pitch $P_1$ and that is devoid of pattern 6. In other words, the coherent template of patterns 6 formed in first mask 5 is kept between the different sets of patterns defined within second mask 7.

Second mask 7 corresponds to the intersection between first mask 5 and an intermediate mask 8. Only the patterns common to first mask 5 and to intermediate mask 8 are used.

In a particular embodiment, a part of first mask 5 is subjected to electronic radiation or to electromagnetic radiation so as to modify the material of the copolymer layer forming patterns 6. In this way, a part of the patterns is eliminated and the other part is kept. This partial modification of first mask 5 makes it possible to form intermediate mask 8 directly in first mask 5 and therefore to form second mask 7. Second mask 7 comprises a second series of patterns chosen from the first series of patterns 6.

Second mask 7 comprises less patterns than first mask 5. However, the patterns originate from first mask 5 and they therefore present a separation distance between one another which is equal to the repetition pitch of first mask 5 or which is an integral multiple of the repetition pitch of first mask 5.

Copolymer layer 3 is etched in order to texture second mask 7 and to define the patterns of second mask 7 with covered areas and uncovered areas.

At least one of the polymers of self-assembled copolymer layer 3 is eliminated so as to define the patterns that are kept, i.e. first holes 6 or salient patterns.

Figure 4:
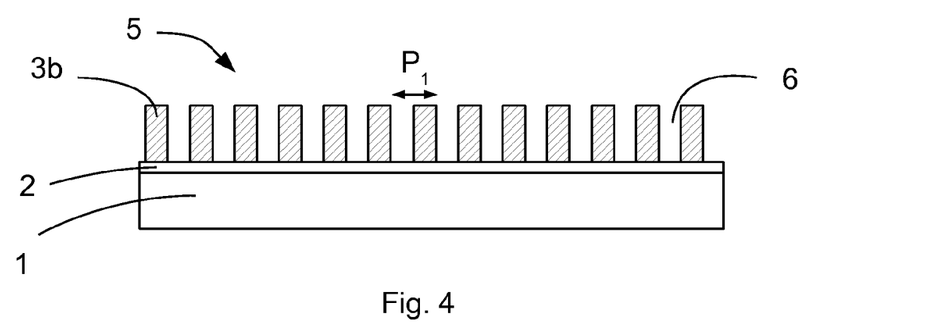

In another alternative embodiment, first mask 5 defined by copolymer layer 3 is etched to define all the patterns 6 above covering layer 2 with uncovered areas and covered areas. As indicated in FIG. 4, copolymer layer 3 is etched so as to eliminate one of the copolymers.

According to the configurations described in the foregoing, when elimination of one of the copolymers is performed, it is possible to form a template of patterns which is a template of holes or a template of salient patterns. It is also possible to form a template with an alternation of holes and salient patterns. In the description that follows, mention is made of formation of a template of holes, but the person skilled in the art will keep in mind that first mask 5 can also form a template of salient patterns.

Selective removal of one of the polymers of copolymer layer 3 can be performed by any suitable technique, for example by means of an etching agent which reacts with one of the polymers only, for example a solvent. It is also possible to subject copolymer layer 3 to electromagnetic radiation which will harden one of its constituents thereby facilitating the removal conditions of the other constituent. It can also be envisaged to degrade or weaken one of the constituents of copolymer layer 3 by means of the electromagnetic radiation.

In an alternative embodiment, if copolymer layer 3 is thick enough and if a difference of etching rate exists between the different constituents of copolymer layer 3, it is possible to subject copolymer layer 3 to reactive ion etching. First mask 5 is formed as soon as one of the constituents has disappeared.

For example, to eliminate a first type of polymer 3a present in the block copolymer, reactive ion etching is performed by means of a dioxygen plasma. First holes 6 surrounded by polymer 3b (see FIG. 4) are then obtained. First mask 5 presents a plurality of first holes 6 which are separated from one another with a repetition pitch $P_1$ which initially existed in copolymer layer 3. In a particular embodiment, reactive ion etching with a hydrogen bromide (HBr) plasma is performed to modify the structure of the copolymer and to prevent the copolymer from being damaged by the solvent of the resin deposited in the subsequent steps. In an alternative embodiment, reactive ion etching is not used and the person skilled in the art will seek to use a resin having a solvent compatible with the material forming first mask 5.

In one embodiment, first mask 5 is formed by polymer 3b which remains after elimination of polymer 3a of copolymer layer 3. In an alternative embodiment, the pattern formed by copolymer layer 3 is reproduced in an intermediate layer arranged between copolymer layer 3 and covering layer 2 to form first mask 5.

When definition of first holes 6 of first mask 5 is performed, it is possible to etch the other polymer material 3b of copolymer layer 3, which enables the sizes of first holes 6 to be slightly increased. This increase of the sizes of first holes 6 with respect to what was initially defined in copolymer layer 3 is performed while at the same time preserving repetition pitch $P_1$. The preferential shapes of the first holes can be cylindrical or lamellar.

In certain configurations, first mask 5 forms an alternation of empty lines and of lines made from polymer materials. In other configurations, first mask 5 forms a template of holes in a layer of polymer material. In an opposite configuration to the previous configuration, first mask 5 forms a template of salient patterns.

Figure 5:
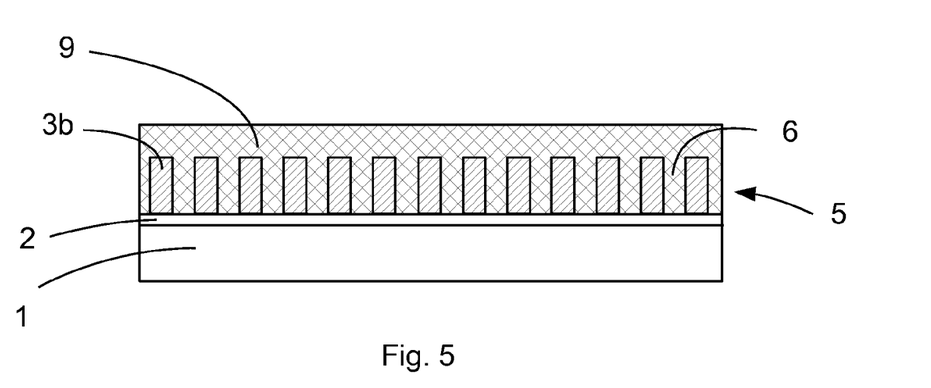

In an alternative embodiment, a resin layer 9 is then deposited so as to cover substrate 1 and first mask 5 (cf. FIG. 5).

Figure 6:
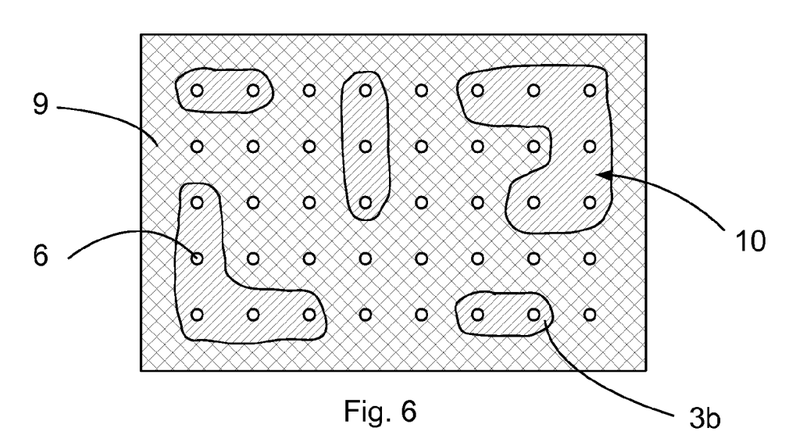

Resin layer 9 is subjected to electronic or electromagnetic radiation so as to form an intermediate mask 8 on first mask 5. Intermediate mask 8 defines second patterns 10, as depicted in FIG. 6. As the second patterns 10 are defined from a photolithography step, there is a great freedom in definition of the patterns and therefore in the shape and dimensions of the second patterns and in the separation distances. In intermediate mask 8, second patterns 10 can be spaced apart from one another with a second repetition pitch $P_2$ which is larger than first repetition pitch $P_1$ of first patterns 6. It is also possible for intermediate mask 8 not to present a second repetition pitch $P_2$. Intermediate mask 8 therefore enables repetition pitch $P_2$ to be adjusted according to the user's requirement. It is for example possible to produce an intermediate mask 8 having repetition pitches $P_{2X}$ and $P_{2Y}$ in a first direction and a second direction.

Figure 7:
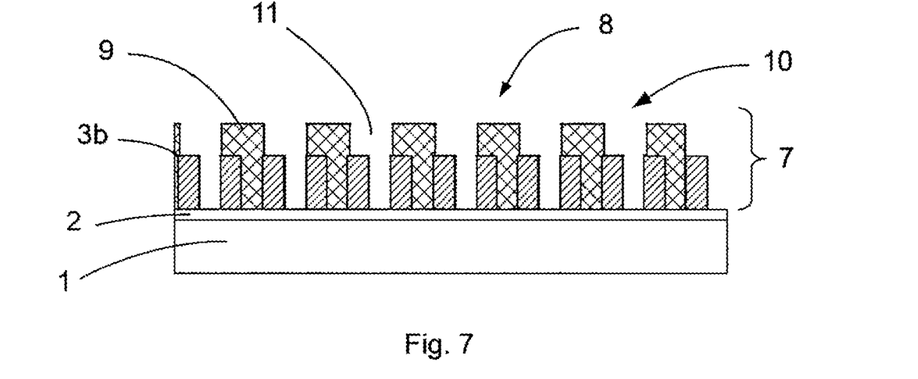

According to a first particular embodiment illustrated in FIG. 7, second mask 7 can comprise a second series of patterns 11 with a repetition pitch that is equal to twice repetition pitch $P_1$.

Figure 10:
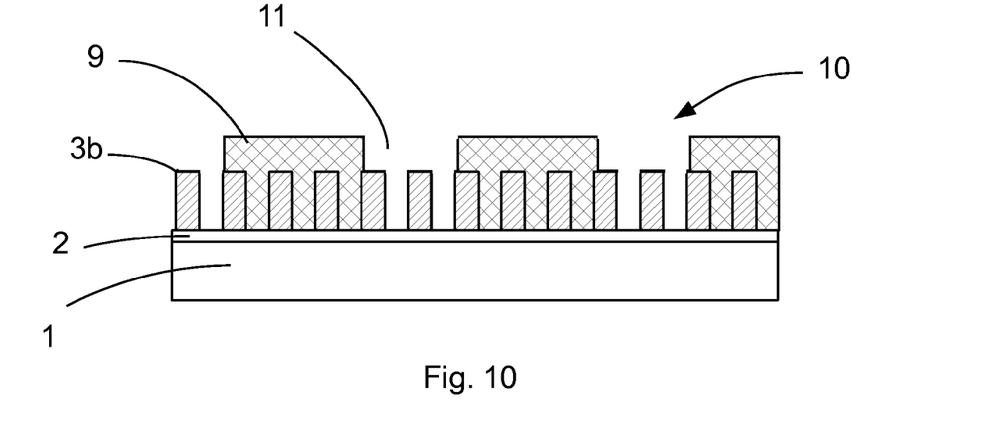

According to another embodiment illustrated in FIG. 10, the second series of patterns 11 can be broken down into groups of several first patterns 6 presenting first repetition pitch $P_1$, the groups repeating themselves according to an integral multiple of first repetition pitch $P_1$, here five times first repetition pitch $P_1$.

Advantageously, the second series of patterns comprises at least three groups of several first patterns.

In certain portions, the holes of intermediate mask 8 are facing first holes 6 of first mask 5, which enables covering layer 2 to be reached on substrate 1.

It is then possible to etch covering layer 2 and possibly substrate 1 by means of a second mask 7 which corresponds to the intersection of the first holes in first mask 5 and of the second holes in intermediate mask 8. Second mask 7 is formed by patterns 11 (here holes) having the minimum dimensions of first mask 5 as the holes correspond to the dimensions of the patterns made from copolymers.

However, compared with first mask 5, second mask 7 comprises areas without holes which enable covering layer 2 to be protected, which is not possible with first mask 5. It is therefore possible to have, in second mask 7, large surfaces where covering layer 2 is protected and areas in which covering layer 2 can be etched by means of thin patterns 11 (holes or salient areas) and with a density that can be equal to that of first mask 5.

It is advantageous to form a first mask 5 with a large density of first patterns 6, i.e. first patterns 6 have small dimensions and they are very close to one another. By means of intermediate mask 8, it is possible to adjust the density of patterns 11 finally present in second mask 7 without modifying the dimensions of first patterns 6 defined in first mask 5. In order to divide the density of first patterns 11 in second mask 7 by two compared with first mask 5 while at the same time keeping a homogeneous distribution of patterns 11, it suffices for the lithography method used to define intermediate mask 8 to present a minimum repetition pitch $P_2$ equal to twice the repetition pitch of first patterns $P_1$ in the block copolymers ($P_2 \geq 2 \cdot P_1$). In this way, one first pattern 6 out of two is covered by intermediate mask 8 and second mask 7 can leave half of first patterns 6 apparent where this is necessary.

To reduce the density of patterns in second mask 7 compared with first mask 5 even further, it suffices to form larger covering areas so as to cover for example two successive first patterns 6.

To have more than a half of the patterns 6 initially present in first mask 5, it suffices for example to leave uncovered or to uncover two successive first patterns 6 and to cover the next first pattern. This configuration can be obtained by means of a lithography step in which the minimum distance between two successive patterns of intermediate mask 8 is equal to more than twice the repetition pitch of first patterns 6, here three times the repetition pitch of first patterns 6.

It is also possible to form areas of second mask 7 with a very high pattern density leaving all the first patterns 6 of first mask 5 uncovered. Different sets of patterns 11 are thus formed in second mask 7.

The maximum flexibility for second mask 7 is obtained when intermediate mask 8 is made with a lithography step which presents a minimum distance between two successive patterns that is equal to twice the repetition pitch of first patterns 6.

In other words, first mask 5 enables a template of first patterns 6 having small dimensions and with a very small repetition pitch $P_1$ to be defined, but it is not possible to define different organizations of patterns 6 within first mask 5. Intermediate mask 8 formed on first mask 5 enables the design of first mask 5 to be adjusted by defining covering areas where first patterns 6 are covered. By means of this intermediate mask 8, it is possible to keep the advantages of first mask 5 while reducing the drawbacks of such a structure. Second mask 7 can present a great flexibility in its density of patterns 11, from the large density of first mask 5 through to complete coverage of the areas to be protected.

In particularly advantageous manner, intermediate mask 8 is then used by means of electron beam lithography as this makes it possible to have a small separation distance between two successive patterns. In advantageous manner, copolymer layer 3 is configured so as to present first patterns 6 having a dimension that is smaller than or equal to what is able to be achieved by electron beam lithography. If first repetition pitch $P_1$ is small, it is advantageous to form intermediate mask 8 with electron beam lithography. In this way, the imperfections of the electron beam lithography step (shot noise) are greatly smoothed out by first patterns 6 already formed in first mask 5.

In advantageous manner, the width of the electron beam used is chosen to be at least twice as large as the width of the first holes to be sealed or to be uncovered depending on the polarity of resin used. In this way, if the axis of revolution of the electron beam does not perfectly match the axis of revolution of first pattern 6 (if the latter is cylindrical), the latter can all the same be completely uncovered or resealed.

On account of the fact that the time spent to perform this step is relatively long, it may be judicious to use a direct write tool by multiple electron beams.

It should also be noted that depending on the required level of resolution, it is possible to replace electron beam lithography by photolithography using a radiation in the deep ultraviolet.

Figure 8:
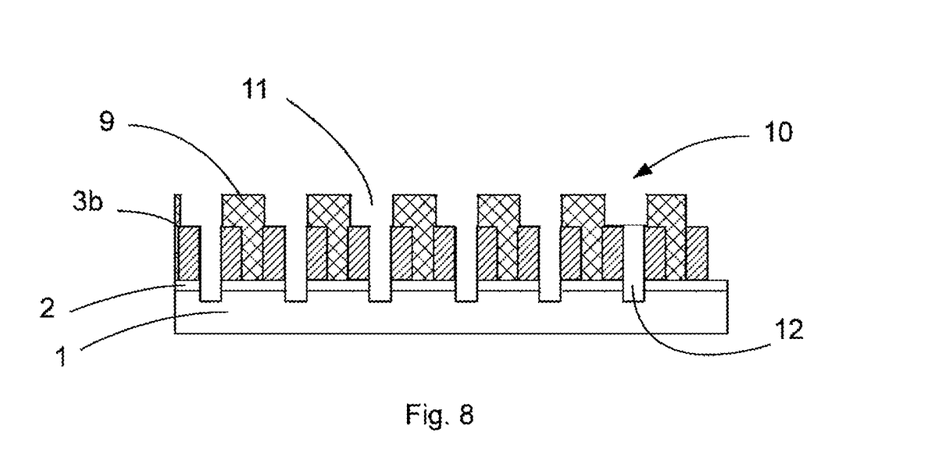
Figure 11:
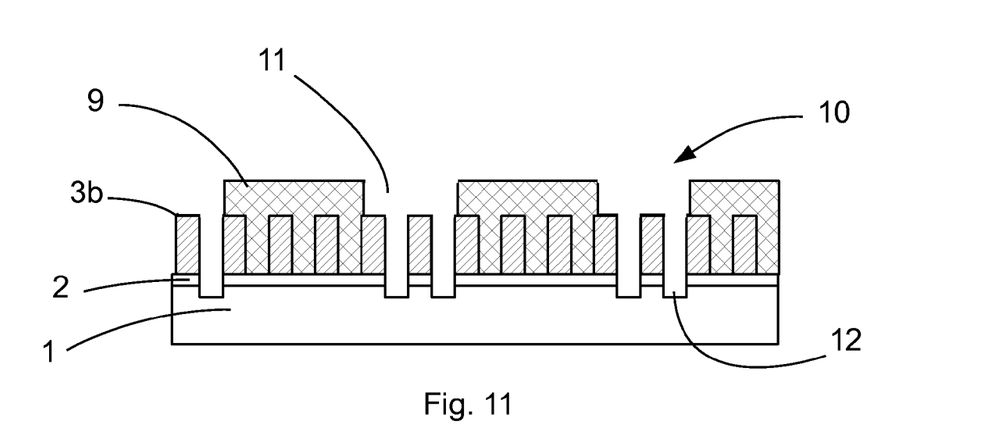

Once second mask 7 has been defined, covering layer 2 and substrate 1 if applicable are etched so as to present an equivalent or substantially equivalent pattern 11 to the one present in second mask 7 (cf. FIGS. 8 and 11).

Figure 9:
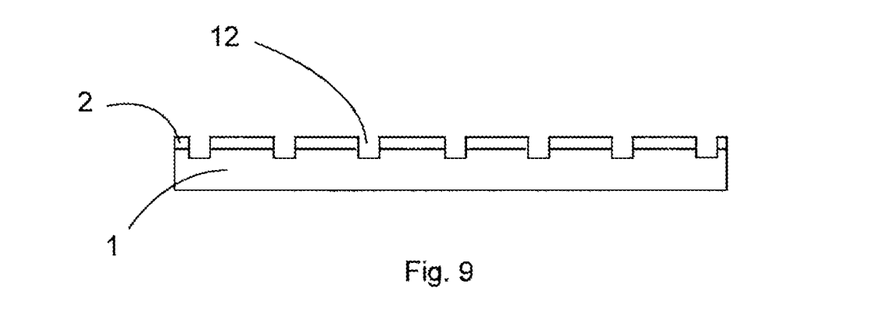

Second mask 7 is eliminated (cf. FIGS. 9 and 12), i.e. first mask 5 and intermediate mask 8, before or after deposition of a first material 13.

First material 13 is advantageously deposited in the holes 12 formed in covering layer 2 to create patterns made from first material 13. The patterns made from first material 13 have substantially equal dimensions to those defined in second mask 7 and their repetition density is equal to that defined in second mask 7.

This method for defining holes of small sizes and with a large variation in the density of the holes is particularly advantageous for producing electric conductors in an integrated circuit.

Figure 12:
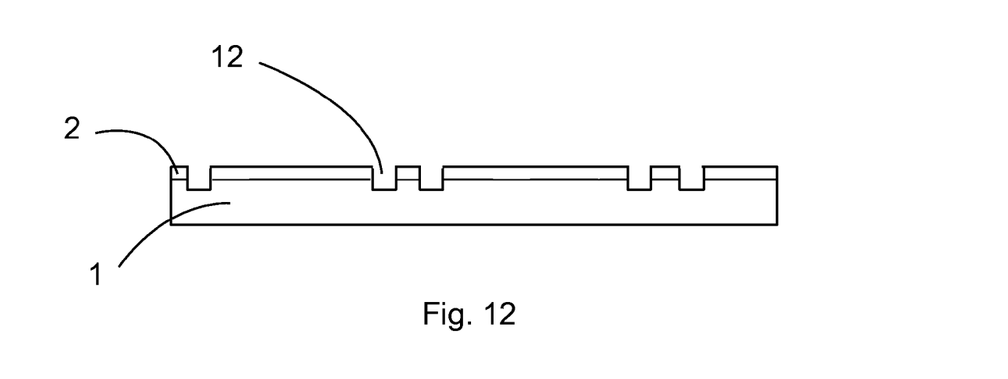

In an advantageous embodiment, substrate 1 is for example of the type depicted in FIG. 12. This substrate is a crystalline semiconductor substrate 1 which already comprises several transistors 101 or either active or passive devices formed beforehand. The different devices are formed on substrate 1 and are disposed with different arrangements. For example, for a transistor 101, a contact has to be defined for source electrode 102, for drain electrode 103 and for gate electrode 104. It may be necessary to define a contact for biasing of the substrate. If gates 104 of transistors 101 are separated from one another by a repetition pitch $P_X$, it is necessary to define a repetition pitch that is smaller than or equal to that of transistors 101 to define the contacts of the transistors. The different transistors are connected to one another and to other devices to form functionalities of an integrated circuit. The connections of the transistors are made by metallic lines and metallic contacts.

By way of example, transistors 101 are covered by covering layer 2, which is for example an electrically insulating layer, and the gates of transistors 104 are flush to define a template of dots which will impose the position of first holes 6 subsequently used to form contacts on source electrode 102 and drain electrode 103.

In another alternative embodiment, transistors 101 are completely covered by covering layer 2 and dots will be formed to force copolymer layer 3 to present a first repetition pitch $P_1$ compatible with that of transistors 101 and/or with that of their electrodes. The same can be the case to form metallic contacts in the interconnection levels above transistors 101.

In preferential manner, covering layer 2 is electrically insulating and is covered by a second layer 2b made from an anti-reflective material, this layer being known under the abbreviation ARC standing for Anti Reflective Coating, which is deposited above the polysilicon layer which in this case forms the gate electrode. This layer 2b absorbs the reflected waves at the interface between substrate 1 and layer 2 which is immediately deposited on its surface to prevent parasite reflections when the patterns are defined in the subsequent lithography steps.

Implementation of the method is similar to that described in the foregoing. In an embodiment presented for illustrative and non-restrictive purposes only, a conventional photolithography is performed to define dots 4. For this, a resin layer is deposited, for example cesist 9. Exposure of resin layer 9 is then performed through a mask, with an ultraviolet source having a wavelength equal to 193 or 248 nanometres. This lithography step is performed with a lower definition than the step in which the dimensions of gate electrodes 104 are defined.

First dots 4 are formed on electrically insulating layer 2 in order to force copolymer layer 3 to present patterns having an orientation and/or a dimension and/or a first repetition pitch compatible with the definition of electric conductors. Dots 4 separate areas of the substrate for which it is possible to expose a repetition pitch. In this way, by adjusting the dimensions of dots 4 and the distance separating two successive dots, it becomes possible to place first holes 6 above the electrodes of the transistor. In advantageous manner, first repetition pitch $P_1$ is smaller than the smallest dimension (length or width) defining an electrode or in more general manner an area to be connected. In advantageous manner, first mask 5 is configured so as to place a single hole facing the gate electrode along an axis which connects the source electrode to the drain electrode passing via the gate electrode. In this way, in the lengthwise direction of the gate, there are not several adjacent holes opening onto the gate electrode.

Copolymer block layer 3 is then deposited and self-assembled using chemical epitaxy or graphic epitaxy. First holes 6 are formed to define first mask 5. In advantageous manner, if transistors 101 or other devices are aligned in a first direction so as to present a repetition pitch $P_X$, it is advantageous to force copolymer layer 3 to present patterns and therefore future first holes 6 in a second direction secant to the first direction.

Figure 14:
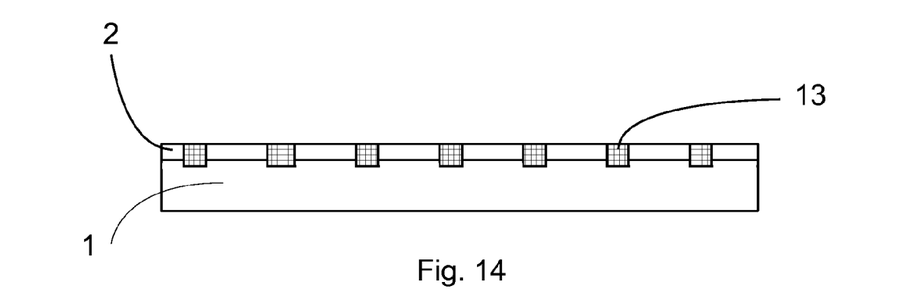
Figure 15:
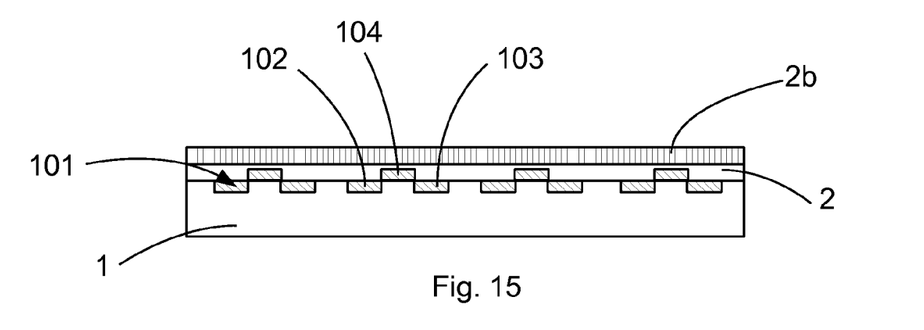
FIG. 15 presents, in schematic manner, the type of substrate on which a template of conductors according to an embodiment of the invention is printed.
Figure 16:
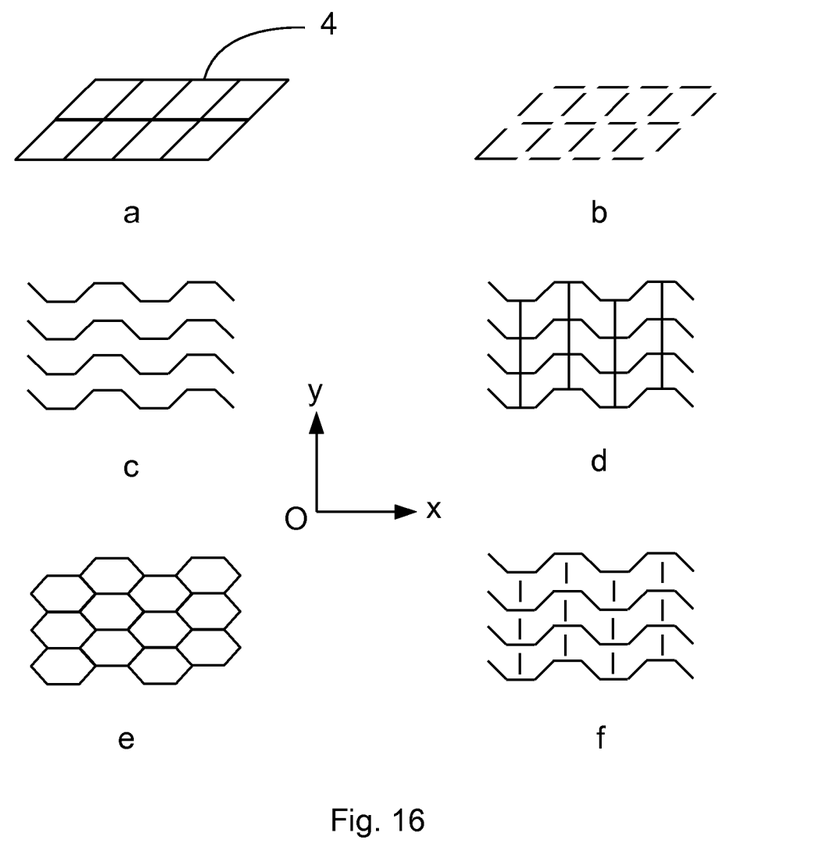
FIGS. 16 and 17 present different designs for the template of first patterns.
Figure 17:
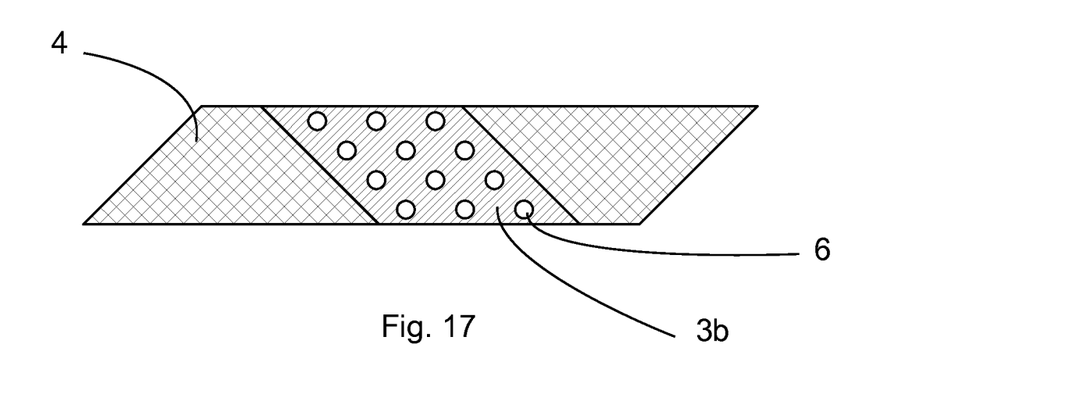

When the template of transistors is a template extending in two secant directions, it can be advantageous for dots 4 forcing the orientation of the copolymer patterns to be configured in such a way that the direction of repetition of the patterns forms an angle of 45° with the direction of repetition of the transistors. It is advantageously the lateral surfaces of dots 4 which define the direction of alignment of the patterns, for example a direction orthogonal to the lateral surface of the pattern (cf. FIG. 14).

Figure 13:
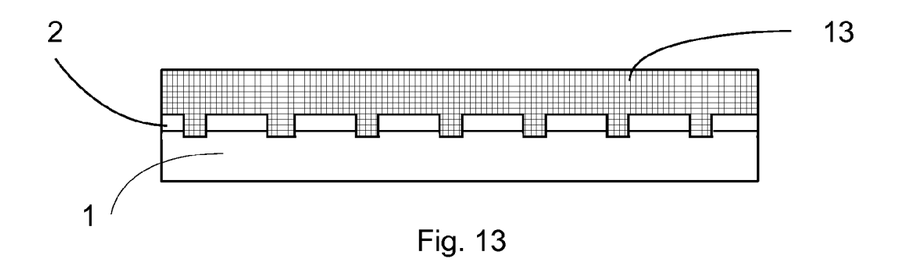

The same is the case for formation of the metallic contacts, which are for example cylindrical, in an intermediate interconnection level arranged between two other interconnection levels incorporating metallic lines. Each of the interconnection levels comprises metallic lines having longitudinal axes oriented either in a first direction or in a second direction perpendicular to the first direction. The offset of the direction of repetition of the first holes by an angle of 45° with respect to these two perpendicular orientations facilitates the connections of the different lines preventing two facing lines from short-circuiting. The 45° offset makes it easier to choose the area where the contact is sought for and therefore to define the area where the first holes have to be filled in. Several patterns having the property of having all the oblique angles equal to 45° with respect to the directions Ox and Oy of orientation of the other patterns are set out in FIG. 13.

Intermediate mask 8 is then formed on first mask 5 to define second mask 7. Intermediate mask 8 covers the area where a metallic contact is not sought for. It also defines the density of metallic contacts to be formed to ensure connection while at the same time preventing short-circuiting. By way of example, for contact formation on source electrode 102, drain electrode 103 and gate electrode 104, intermediate mask 8 comes and covers first holes 6 being able to overlap gate electrode 104 and one of source electrodes 102 and drain electrodes 103.

First mask 5 can define holes 6 with a lamellar or cylindrical organization so as to define lines or vias. In one embodiment, two levels containing lines oriented in two perpendicular directions Ox and Oy are separated by a level containing cylindrical contacts presenting a repetition pitch P in a direction offset 45° from the directions Ox and Oy.

Covering layer 2 is etched through second mask 7 and a metallic material 13 is deposited in holes 12 of covering layer 2 to form metallic contacts, for example by evaporation of a metal.

For the electron beam to be able to open previously formed first holes 6 without enlarging them, it is important for polymer 3b surrounding each first hole 6 not to be very sensitive to the electrons of the beam. This can for example be achieved by depositing a much thicker resin layer 9 than the height of first holes 6 to be opened.

The invention claimed is:

1. A method for fabricating patterns from a first material comprising the following steps:
providing a substrate covered by a covering layer,
forming a first mask by means of a self-assembled structure of block copolymers, the first mask defining a first series of first patterns organized with a first repetition pitch,
making a second mask from the first mask, the second mask comprising a second series of patterns organized according to the first repetition pitch, the second series of patterns comprising less patterns than the first series of patterns,
etching the covering layer through the second mask to define patterns in the covering layer,
wherein the substrate comprises devices aligned in a first direction, and wherein a template of first pads is deposited on the covering layer before forming the first mask, the template of first pads being oriented in a second direction secant to the first direction.

2. The method according to claim 1, wherein the second series of patterns is broken down into groups of several first patterns having the first repetition pitch, the groups being repeated with a pitch that is an integral multiple of the first repetition pitch.

3. The method according to claim 1, further comprising depositing and exposing a resin layer so as to form an intermediate mask on the first mask, the intermediate mask covering a part of the first series of patterns formed in the first mask and comprising patterns facing the first series of patterns so as to form the second series of patterns of the second mask.

4. The method according to claim 1, further comprising after the etching step of the covering layer, depositing a first material to fill holes in the covering layer and/or in the substrate and forming patterns made from first material.

5. The method according to claim 3, wherein the intermediate mask is formed by electron beam lithography, the resolution of the electron beam being at least twice as great as a width of the first series of patterns.

6. The method according to claim 1, wherein the second direction forms an angle of 45° with the first direction.

7. The method according to claim 1, wherein the template of first pads is made by modification of a chemical affinity of portions of the substrate with the copolymer layer to modify the first repetition pitch of the first series of patterns by chemical epitaxy and photolithography.

8. The method according to claim 1, wherein the template of first pads is formed by photolithography to modify the first repetition pitch of the first series of patterns by graphic epitaxy.

9. The method according to claim 8, further comprising forming spacers on an additional mask to form the template of first pads.

10. A method for fabricating patterns from a first material comprising the following steps:
providing a substrate covered by a covering layer,
forming a first mask by means of a self-assembled structure of block copolymers, the first mask defining a first series of first patterns organized with a first repetition pitch,
forming an intermediate mask on the first mask, the intermediate mask comprising intermediate patterns organized with an intermediate repetition pitch and covering a part of the first series of first patterns, the intermediate repetition pitch being an integral multiple of the first repetition pitch, the first mask and the intermediate mask forming a second mask comprising a second series of patterns, the second series of patterns having the intermediate repetition pitch, the intermediate pattern comprising at least one first pattern, and
etching the covering layer through the second mask to define patterns in the covering layer.

11. The method according to claim 10, wherein the second series of patterns is broken down into groups of several first patterns having the first repetition pitch, the groups being repeated with a pitch that is an integral multiple of the first repetition pitch.

12. The method according to claim 10, comprising depositing and exposing a resin layer so as to form the intermediate mask on the first mask.

13. The method according to claim 10, further comprising after the etching step of the covering layer, depositing a first material to fill holes in the covering layer and/or in the substrate and forming patterns made from first material.

14. The method according to claim 10, wherein the intermediate mask is formed by electron beam lithography, the resolution of the electron beam being at least twice as great as a width of the first series of patterns.

15. The method according to claim 10, wherein the substrate comprises devices aligned in a first direction, and wherein a template of first pads is deposited on the covering layer before forming the first mask, the template of first pads being oriented in a second direction secant to the first direction.

16. The method according to claim 15, wherein the second direction forms an angle of 45° with the first direction.

17. The method according to claim 15, wherein the template of first pads is made by modification of a chemical affinity of portions of the substrate with the copolymer layer to modify the first repetition pitch of the first series of patterns by chemical epitaxy and photolithography.

18. The method according to claim 15, wherein the template of first pads is formed by photolithography to modify the first repetition pitch of the first series of patterns by graphic epitaxy.

19. The method according to claim 18, further comprising forming spacers on an additional mask to form the template of first pads.

* * * * *